US010312419B2

(12) United States Patent
Oh et al.

(10) Patent No.: US 10,312,419 B2
(45) Date of Patent: Jun. 4, 2019

(54) WHITE LIGHT EMITTING DEVICES

(71) Applicant: Samsung Electronics Co., Ltd., Suwon-si, Gyeonggi-do (KR)

(72) Inventors: Jeong Rok Oh, Suwon-si (KR); Jeong Eun Yun, Hwaseong-si (KR); Sung Woo Choi, Suwon-si (KR); Cho Hui Kim, Hwaseong-si (KR); Chul Soo Yoon, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 15/838,594

(22) Filed: Dec. 12, 2017

(65) Prior Publication Data

US 2018/0323350 A1 Nov. 8, 2018

(30) Foreign Application Priority Data

May 2, 2017 (KR) ........................ 10-2017-0056531

(51) Int. Cl.
*H01L 33/50* (2010.01)
*C09K 11/77* (2006.01)
(Continued)

(52) U.S. Cl.
CPC ........ *H01L 33/504* (2013.01); *C09K 11/7734* (2013.01); *H01L 25/0753* (2013.01);
(Continued)

(58) Field of Classification Search
CPC ..... H01L 33/504; H01L 33/486; H01L 33/60; H01L 33/62; H01L 25/0753
See application file for complete search history.

(56) References Cited

U.S. PATENT DOCUMENTS 6,372,608 B1 4/2002 Shimoda et al.
6,645,830 B2 11/2003 Shimoda et al.
(Continued)

FOREIGN PATENT DOCUMENTS

EP 2056366 A1 5/2009
EP 2432037 A1 3/2012
(Continued)

OTHER PUBLICATIONS

Extended European Search Report dated Dec. 7, 2018 for corresponding European Application No. 18169159.3.

*Primary Examiner* — Sitaramarao S Yechuri
(74) *Attorney, Agent, or Firm* — Harness, Dickey & Pierce, P.L.C.

(57) ABSTRACT

A white light emitting device may include a blue light emitting diode configured to emit blue light and a plurality of wavelength conversion materials configured to convert the blue light into light having different wavelengths based on being excited by the blue light, and emit white light based on the converting, wherein the emitted white light is associated with an Illuminating Engineering Society (IES) TM-30-15 Fidelity Index ($R_f$) in a range of 78 to 89, an IES TM-30-15 Chroma Change by Hue Index $R_{cs15}$ in a range of 7% to 16%, and an IES TM-30-15 Chroma Change by Hue Index $R_{cs16}$ in a range of 7% to 16%, and a color difference between a reflection spectrum of a white specimen of the emitted white light, and International Commission on Illumination (CIE) Standard illuminant D65, that is equal to or less than 106.

19 Claims, 9 Drawing Sheets

(51) Int. Cl.
  *H01L 25/075* (2006.01)
  *H01L 33/62* (2010.01)
  *H01L 33/60* (2010.01)
  *H01L 33/48* (2010.01)

(52) U.S. Cl.
  CPC .......... *H01L 33/486* (2013.01); *H01L 33/502* (2013.01); *H01L 33/60* (2013.01); *H01L 33/62* (2013.01)

(56) References Cited

U.S. PATENT DOCUMENTS

| | | | |
|---|---|---|---|
| RE38,466 E | 3/2004 | Inoue et al. |
| 6,818,465 B2 | 11/2004 | Biwa et al. |
| 6,818,530 B2 | 11/2004 | Shimoda et al. |
| 6,858,081 B2 | 2/2005 | Biwa et al. |
| 6,967,353 B2 | 11/2005 | Suzuki et al. |
| 7,002,182 B2 | 2/2006 | Okuyama et al. |
| 7,084,420 B2 | 8/2006 | Kim et al. |
| 7,087,932 B2 | 8/2006 | Okuyama et al. |
| 7,154,124 B2 | 12/2006 | Han et al. |
| 7,208,725 B2 | 4/2007 | Sherrer et al. |
| 7,288,758 B2 | 10/2007 | Sherrer et al. |
| 7,319,044 B2 | 1/2008 | Han et al. |
| 7,501,656 B2 | 3/2009 | Han et al. |
| 7,709,857 B2 | 5/2010 | Kim et al. |
| 7,759,140 B2 | 7/2010 | Lee et al. |
| 7,781,727 B2 | 8/2010 | Sherrer et al. |
| 7,790,482 B2 | 9/2010 | Han et al. |
| 7,940,350 B2 | 5/2011 | Jeong |
| 7,959,312 B2 | 6/2011 | Yoo et al. |
| 7,964,881 B2 | 6/2011 | Choi et al. |
| 7,985,976 B2 | 7/2011 | Choi et al. |
| 7,994,525 B2 | 8/2011 | Lee et al. |
| 8,008,683 B2 | 8/2011 | Choi et al. |
| 8,013,352 B2 | 9/2011 | Lee et al. |
| 8,049,161 B2 | 11/2011 | Sherrer et al. |
| 8,129,711 B2 | 3/2012 | Kang et al. |
| 8,179,938 B2 | 5/2012 | Kim |
| 8,263,987 B2 | 9/2012 | Choi et al. |
| 8,324,646 B2 | 12/2012 | Lee et al. |
| 8,399,944 B2 | 3/2013 | Kwak et al. |
| 8,432,511 B2 | 4/2013 | Jeong |
| 8,459,832 B2 | 6/2013 | Kim |
| 8,502,242 B2 | 8/2013 | Kim |
| 8,536,604 B2 | 9/2013 | Kwak et al. |
| 8,735,931 B2 | 5/2014 | Han et al. |
| 8,766,295 B2 | 7/2014 | Kim |
| 8,933,620 B2 | 1/2015 | Mori et al. |
| 2007/0170842 A1* | 7/2007 | Bokor ................ C09K 11/0883 313/503 |
| 2008/0180948 A1 | 7/2008 | Yoon et al. |
| 2014/0167646 A1 | 6/2014 | Zukauskas et al. |
| 2014/0354146 A1* | 12/2014 | Ishiwata ................ H01L 33/502 313/512 |
| 2016/0380163 A1 | 12/2016 | Horie |
| 2017/0040501 A1 | 2/2017 | Choi et al. |

FOREIGN PATENT DOCUMENTS

| | | |
|---|---|---|
| EP | 2610925 A2 | 7/2013 |
| EP | 2785143 A1 | 10/2014 |
| JP | 5315616 B2 | 10/2013 |
| JP | 2014-194843 A | 10/2014 |
| JP | 2015-061009 A | 3/2015 |
| JP | 2016-201451 A | 12/2016 |
| KR | 2017-0018202 A | 2/2017 |

* cited by examiner

WHITE LIGHT EMITTING DEVICES

CROSS-REFERENCE TO RELATED APPLICATION

This application claims benefit of priority under 35 U.S.C. § 119 to Korean Patent Application No. 10-2017-0056531, filed on May 2, 2017 in the Korean Intellectual Property Office, the disclosure of which is incorporated herein by reference in its entirety.

BACKGROUND

1. Field

The present disclosure relates to white light emitting devices and lighting devices.

2. Description of Related Art

In general, a wavelength conversion material, such as a phosphor, is used as a material for converting light in a specific wavelength, from various light sources, into light of a desired wavelength. In detail, light emitting diodes of various light sources may be advantageously configured to be used as LCD backlights, automotive lighting devices, and/or home lighting devices, due to their qualities of low power driving and excellent light efficiency.

In general, a white light emitting device is implemented by applying a plurality of phosphors (for example, green and red or blue, yellow and red) to a blue or ultraviolet LED chip.

In recent years, in the field of white lighting, light emitting devices configured to provide white light having increased degrees of vividness of white and primary colors has been required. For example, various types of spot lighting are currently required, such as vivid white lighting for clothing, capable of emphasizing a white color.

SUMMARY

Some example embodiments include a white light emitting device configured to emit white light associated with an enhanced degree of vividness of white and primary colors.

Some example embodiments include a lighting device configured to emit white light associated with an enhanced degree of vividness of white and primary colors.

According to some example embodiments, a white light emitting device may include a blue light emitting diode configured to emit blue light; and a plurality of wavelength conversion materials. The plurality of wavelength conversion materials may be configured to convert the emitted blue light into light having different wavelengths based on being excited by the emitted blue light, and emit white light based on the converting the emitted blue light, such that the emitted white light is associated with an Illuminating Engineering Society (IES) TM-30-15 Fidelity Index ($R_f$) in a range of 78 to 89, an IES TM-30-15 Chroma Change by Hue Index $R_{cs15}$ in a range of 7% to 16%, and an IES TM-30-15 Chroma Change by Hue Index $R_{cs16}$ in a range of 7% to 16%, and a color difference between a reflection spectrum of a white specimen of the emitted white light and International Commission on Illumination (CIE) Standard illuminant D65 may be equal to or less than 106, the white specimen having a white color corresponding to Munsell N9.

According to some example embodiments, a white light emitting device may include a blue light emitting diode configured to emit blue light; a first wavelength conversion material configured to be excited by the blue light and emit green light; and a second wavelength conversion material configured to be excited by the blue light and emit red light, wherein the white light emitting device is configured to emit white light based on mixing the blue light, the green light, and the red light, such that the emitted white light has an emission spectrum including a first peak wavelength in a range of 440 nm to 455 nm, a second peak wavelength in a range of 530 nm to 540 nm, and a third peak wavelength in a range of 640 nm to 650 nm, and wherein a lowest intensity of the emitted white light between the second peak wavelength and the third peak wavelength, the lowest intensity of the emitted white light being 45% to 55% of a maximum peak intensity of the emitted white light among the first peak wavelength, the second peak wavelength, and the third peak wavelength.

According to some example embodiments, a white light emitting device may include a blue light emitting diode configured to emit blue light having a dominant wavelength band of 440 nm to 455 nm; a first green phosphor configured to emit first green light based on being excited by the blue light, the first green light having a peak wavelength of 515 nm to 530 nm and a full width at half-maximum (FWHM) equal to or greater than 50 nm or more; a second green phosphor configured to emit second green light based on being excited by the blue light, the second green light having a peak wavelength of 535 nm to 555 nm and a full width at half-maximum (FWHM) equal to or less than 70 nm; a first red phosphor configured to emit first red light based on being excited by the blue light, the first red light having a peak wavelength of 600 nm to 620 nm and a full width at half-maximum (FWHM) equal to or less than 85 nm; and a second red phosphor configured to emit second red light based on being excited by the blue light, the second red light having a peak wavelength of 640 nm to 665 nm and a full width at half-maximum (FWHM) equal to or greater than 80 nm. The white light emitting device may be configured to emit white light based on mixing the blue light, the first green light, the second green light, the first red light, and the second red light, wherein a color difference between a reflection spectrum of a white specimen of the emitted white light, and International Commission on Illumination (CIE) Standard illuminant D65, is equal to or less than 106, and the white specimen has a white color corresponding to Munsell N9.

According to some example embodiments, a lighting device may include a blue light emitting diode configured to emit blue light; and a plurality of wavelength conversion materials configured to be excited by the blue light and convert the blue light into light having different wavelengths based on being excited, such that the lighting device is configured to emit white light, such that the emitted white light is associated with an Illuminating Engineering Society (IES) TM-30-15 Fidelity Index ($R_f$) in a range of 78 to 89, an IES TM-30-15 Chroma Change by Hue Index $R_{cs15}$ in a range of 7% to 16%, and an IES TM-30-15 Chroma Change by Hue Index $R_{cs16}$ in a range of 7% to 16%, and a color difference of a reflection spectrum of a white specimen of the emitted white light, and International Commission on Illumination (CIE) Standard illuminant D65, is equal to or less than 106, the white specimen having a white color corresponding to Munsell N9.

According to some example embodiments, a lighting device may include a blue light emitting diode configured to emit blue light; a first wavelength conversion material configured to be excited by the blue light to emit a green light; and a second wavelength conversion material configured to be excited by the blue light to emit a red light, wherein the lighting device is configured to emit white light based on mixing the blue light, the green light, and the red light, the emitted white light having an emission spectrum including a first peak wavelength in a range of 440 nm to 455 nm, a second peak wavelength in a range of 530 nm to 540 nm, and a third peak wavelength in a range of 640 nm to 650 nm. An intensity of the second peak wavelength may be 55% to 70% of a maximum peak intensity of the emitted white light among the first peak wavelength, the second peak wavelength, and the third peak wavelength, and a lowest intensity of the emitted white light between the second peak wavelength and the third peak wavelength may be 45% to 55% of the maximum peak intensity of the emitted white light.

BRIEF DESCRIPTION OF DRAWINGS

The above and other aspects, features and other advantages of the present inventive concepts will be more clearly understood from the following detailed description, taken in conjunction with the accompanying drawings, in which.

DETAILED DESCRIPTION

Figure 1:
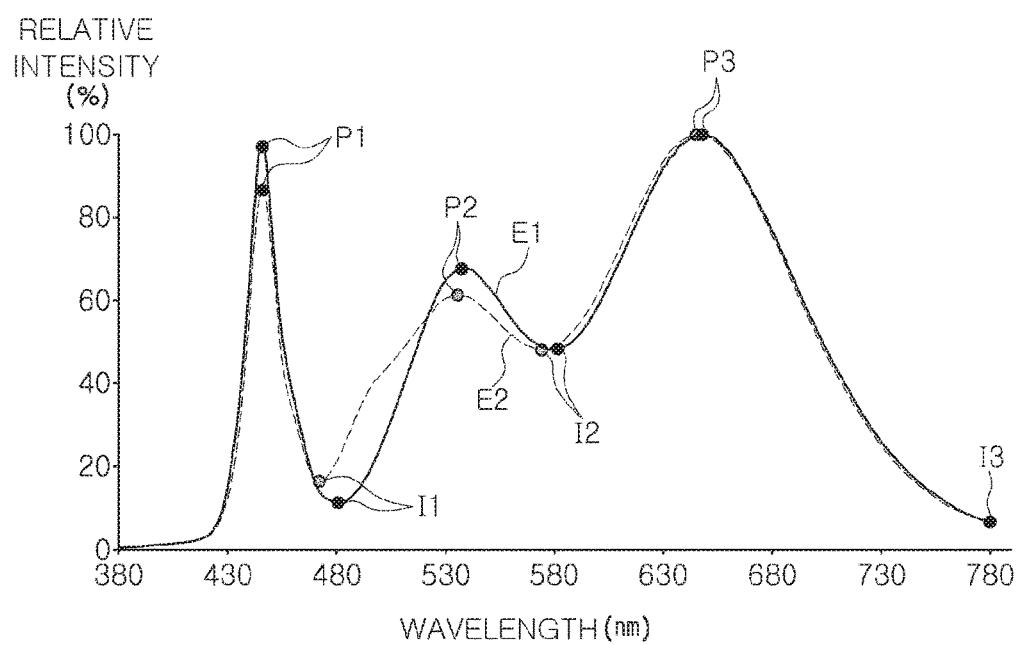
FIG. 1 is a graph illustrating an emission spectrum of white light according to some example embodiments.

A white light emitting device according to some example embodiments of the present inventive concepts may be configured to provide a vivid white light based on a blue light emitting diode thereof. A light emitting device including a blue light emitting diode may include a plurality of wavelength conversion materials configured to emit light having different wavelengths in a visible light band, based on receiving an emitted light.

The plurality of wavelength conversion materials may be configured to provide ("emit") a spectrum of emitted light associated with an improved degree of vividness of white and primary colors, and the spectrum may be at least partially defined based on one or more Illuminating Engineering Society (IES) TM-30-15 indices.

The plurality of wavelength conversion materials may be configured to emit white light that may be specified by ("at least partially defined by," "associated with," etc.) one or more IES TM-30-15 evaluation indices, including IES TM-30-15 Fidelity Index $R_f$ and IES TM-30-15 Chroma Change by Hue Indices $R_{cs, hj}$, (here, j=1 to 16). In some example embodiments, the plurality of wavelength conversion materials may be configured to emit white light that is associated with $R_f$ that is in a range of 78 to 89, $R_{cs15}$ that is in a range of 7% to 16%, and $R_{cs16}$ that is in a range of 7% to 16%, and a color difference between a reflection spectrum of a white specimen of the emitted white light, and International Commission on Illumination (CIE) Standard illuminant D65, may be equal to or less than 106.

In some example embodiments, the plurality of wavelength conversion materials may be configured to emit white light that is specified by ("at least partially defined by," "associated with," etc.) an index representing preferences of vividness, based on a statistical evaluation of preference for color. For example, where the aforementioned $R_f$, $R_{cs15}$, and $R_{cs16}$ indices of the emitted white light denote A, B, and C, respectively, the preference $S_{vp}$ may be defined by Equation 1.

$$S_{vp}=-36.76+A(-5.45\cdot10^{-3}\cdot A+0.915)+B(-6.69\cdot10^{-4}\cdot B^2+1.69\cdot10^{-2}\cdot B-0.114)+C(-6.65\cdot10^{-4}\cdot C^2+2.27\cdot10^{-2}\cdot C-0.18)$$ [Equation 1]

the plurality of wavelength conversion materials may be configured to emit white light that may be associated with the preference, defined in Equation 1, that is equal to or greater than 1.3, which is a number ("value") associated with a significantly increased preference of vividness of vivid white light emitted by light emitting devices of the related art in which the plurality of wavelength conversion materials are absent (for example, 1 or less).

In some example embodiments of the present inventive concepts, the plurality of wavelength conversion materials may be configured to emit white light associated with characteristics that may be represented by a profile of an emission spectrum. To provide emitted white light having an enhanced degree of vividness of a color, the plurality of wavelength conversion materials may be configured to emit white light associated with an emission spectrum that is adjusted in a direction allowing a red region of the emitted white light to have a long wavelength, while weakening a yellow region of the emitted white light.

the plurality of wavelength conversion materials may be configured to emit white light associated with an emission spectrum that may have a first peak wavelength, a second peak wavelength, and a third peak wavelength. The first peak wavelength may be in a range of 440 nm to 455 nm, the second peak wavelength may be in a range of 530 nm to 540 nm, and the third peak wavelength may be in a range of 640 nm to 650 nm. In addition, a lowest intensity of the emitted white light between the second peak wavelength and the third peak wavelength may be 45% to 55% of a maximum peak intensity of the emitted white light. Here, the maximum peak intensity of the emitted white light is a peak intensity, of the emitted white light, of a plurality of peak intensities of the emitted white light, having a greatest intensity of the plurality of peak intensities, for example, a third peak.

The plurality of wavelength conversion materials may be configured to emit the white light based on a wavelength of a blue light ("emitted blue light") that is emitted by a blue light emitting diode and received at the plurality of wavelength conversion materials. A white light emitting device according to some example embodiments may include a blue light emitting diode emitting blue light, as well as a first wavelength conversion material and a second wavelength conversion material that are configured to be excited by the blue light and emit green light and red light, respectively.

Each of the first wavelength conversion material and the second wavelength conversion material may be formed of ("at least partially comprise") two or more wavelength conversion materials, to be configured to secure ("emit light having") a sufficient bandwidth (that is, a full width at half-maximum) in a green region and a red region, while weakening a yellow region. As referred to herein, a color "region" refers to a wavelength spectrum, wavelength "band," etc. of light corresponding to the respective color.

A dominant wavelength band of the blue light may be 440 nm to 455 nm. The first wavelength conversion material may include a first green phosphor configured to emit first green light having a peak wavelength of 515 nm to 530 nm and a full width at half-maximum that is equal to or greater than 50 nm, and a second green phosphor configured to second green light having a peak wavelength of 535 nm to 555 nm and a full width at half-maximum that is equal to or less than 70 nm, based on receiving (e.g., being excited by) the aforementioned blue light, respectively. The second wavelength conversion material may include a first red phosphor configured to emit first red light having a peak wavelength of 600 nm to 620 nm and a full width at half-maximum that is equal to or less than 85 nm, and a second red phosphor configured to emit second red light having a peak wavelength of 640 nm to 665 nm and a full width at half-maximum that is equal to or greater than 80 nm, based on receiving (e.g., being excited by) the aforementioned blue light, respectively.

In some example embodiments, the plurality of wavelength conversion materials may include a wavelength conversion material related to each wavelength that may include an additional wavelength conversion material. For example, the first wavelength conversion material may further include a third green phosphor having ("associated with") a peak wavelength (of light that the third green phosphor is configured to emit based on being excited by the aforementioned blue light) of 515 nm to 525 nm. The second wavelength conversion material may further include a third red phosphor having a peak wavelength (of light that the third red phosphor is configured to emit based on being excited by the aforementioned blue light) of 590 nm to 610 nm, shorter than the peak wavelength of the first red light.

Hereinafter, the operation and effect of the present inventive concepts will be described in detail with reference to Examples of the present inventive concepts.

Example 1

In Example 1, a white light emitting device configured to emit white light, satisfying the conditions described above, was manufactured. Two types of green phosphor and two types of red phosphor were properly combined with a blue light emitting diode having ("associated with") a dominant wavelength (of light that the blue light emitting diode was configured to emit) of 445 nm, so that a white light emitting device configured to emit white light of ("associated with") an emission spectrum E1, illustrated in FIG. 1, was manufactured.

As the two types of green phosphors, $(Ba,Sr)_2SiO_4$:Eu having a peak wavelength of 521 nm and a full width at half-maximum (FWHM) of 70 nm, and β-SiAlON:Eu having a peak wavelength of 540 nm and a full width at half-maximum of 55 nm, were used. As the two types of red phosphors, $(Sr,Ca)AlSiN_3$:Eu having a peak wavelength of 610 nm and a full width at half-maximum of 74 nm, and $CaAlSiN_3$:Eu having a peak wavelength of 655 nm and a full width at half-maximum of 90 nm, were used.

Example 2

In Example 2, a white light emitting device, including the phosphor according to Example 1 described above, additionally using one type of green phosphor and one type of red phosphor, and thus configured to emit white light of an emission spectrum E2, illustrated in FIG. 1, was manufactured.

An additional green phosphor is $BaSi_2O_2N_2$:Eu, having a peak wavelength of 497 nm and a full width at half-maximum of 39 nm, and an additional red phosphor is Ca-α-SiAlON:Eu, having a peak wavelength of 595 nm and a full width at half-maximum of 80 nm.

An emission spectrum of white light emitted by a white light emitting device according to Example 1 and an emission spectrum of white light emitted by a white light emitting device according to Example 2 is illustrated in FIG. 1.

With reference to FIG. 1, the emission spectrum of white light according to each of Examples 1 and 2 (E1 and E2) has three peak wavelengths, that is, a first peak wavelength P1, a second peak wavelength P2, and a third peak wavelength P3. The main features of the emission spectrum according to Examples 1 and 2 are illustrated in Table 1.

TABLE 1

| Division | Example 1 | Example 2 |
|---|---|---|
| First peak wavelength P1 | 445 nm | 445 nm |
| Second peak wavelength P2 | 535 nm | 533 nm |
| Third peak wavelength P3 | 647 nm | 644 nm |
| Relative intensity of I1 | 13% | 17% |
| Relative intensity of I2 | 48% | 45% |
| Wavelength difference between I1 and I2 | 100 nm | 103 nm |
| Wavelength difference between I2 and I3 (780 nm) | 201 nm | 207 nm |

Each third peak wavelength P3 (a wavelength of a red peak) of an emission spectrum according to Examples 1 and 2 is 647 nm and 644 nm, and the red peak appears in a wavelength band equal to or greater than 640 nm. Each second peak wavelength P2 (a wavelength of a green peak) of an emission spectrum according to Examples 1 and 2 is 535 nm and 533 nm, and the green peak appears in a wavelength band equal to or less than 540 nm.

In some example embodiments, when an intensity of the third (red) peak wavelength is 100%, each lowest intensity I1 between the second peak wavelength and the third peak wavelength, located in a yellow region, is 48% in Examples 1 and 45% in Examples 2. As described above, the lowest intensity I1 in a yellow region is 55% or less, but is located in an area greater than 45%.

Figure 2:
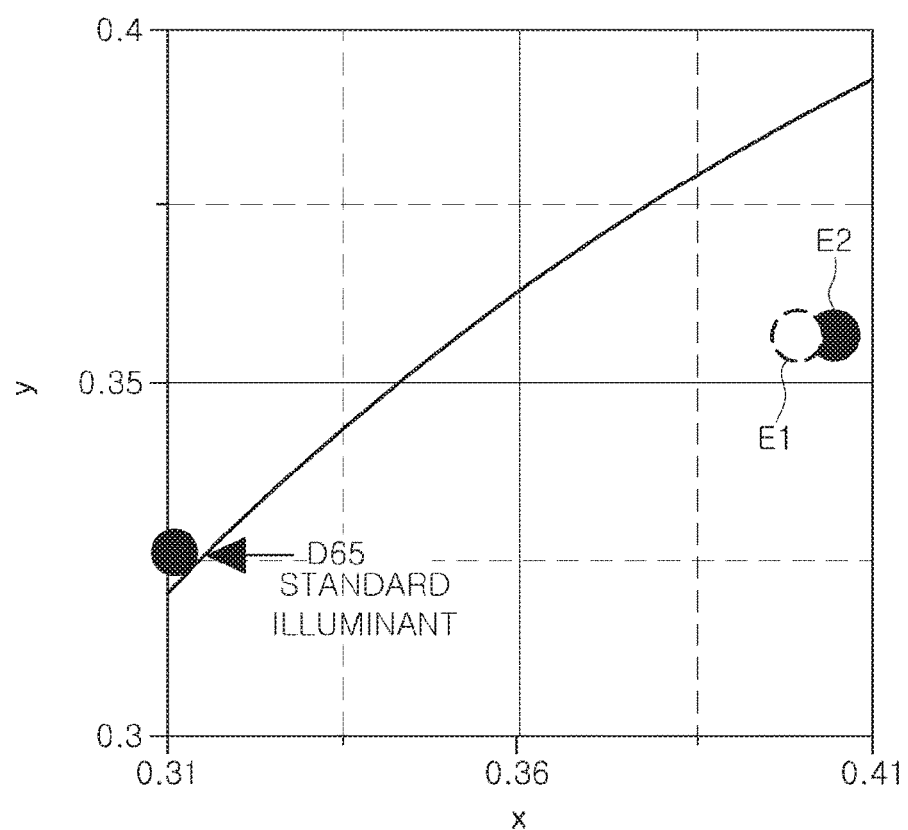
FIG. 2 is a CIE 1931 color space diagram illustrating a color coordinate of a reflection spectrum with respect to a white specimen of white light according to some example embodiments.

To compare a reflection spectrum in which light is reflected by a white specimen (for example, clothing) to Standard Illuminant D65 for evaluation, a color of white light according to Examples 1 and 2 was evaluated. In the evaluation, the white specimen was provided as clothing having a white color, the white color of the white specimen corresponding to Munsell N9 according to the Munsell Book of Color. For a reflection spectrum, light reflected by the white specimen based on being illuminated by white light according to Standard Illuminant D65, Example 1, and/or Example 2 was measured using a spectrometer (model CS1000, by Konica Minolta Inc.), and a color coordinate was obtained from the reflection spectrum having been measured. An evaluation result is illustrated in Table 2 and FIG. 2. Here, FIG. 2 is an enlargement of a portion of a CIE 1931 color space diagram.

TABLE 2

| Division | L* | a* | b* | Color difference from D65 |
|---|---|---|---|---|
| D65 | 179.0 | −12.6 | −13.7 | — |
| Example 1 | 233.9 | 41.6 | 52.3 | 102 |
| Example 2 | 237.0 | 44.1 | 54.3 | 106 |

In general, as a color difference to Standard Illuminant D65 is smaller, it may be evaluated that a preference for a white color is increased.

As described above, characteristics of white light according to some example embodiments may be represented by a profile of an emission spectrum. To enhance a degree of vividness of a color in the white light, an emission spectrum of the white light illustrated in some example embodiments may be adjusted in a direction allowing a red region of the emission spectrum to have a long wavelength, while weakening a yellow region of the emission spectrum. In detail, a first peak wavelength P1 of the emission spectrum may be in a range of 440 nm to 455 nm, a second peak wavelength P2 of the emission spectrum may be in a range of 530 nm to 540 nm, a third peak wavelength P3 of the emission spectrum may be in a range of 640 nm to 650 nm, and a lowest intensity I2, between the second peak wavelength and the third peak wavelength, may be in a range of 45% to 55% of a maximum peak intensity of the emission spectrum among the first peak wavelength, the second peak wavelength, and the third peak wavelength.

Other detailed characteristics of an emission spectrum may be further derived from results illustrated in FIG. 1 and Table 1 obtained in some example embodiments. For example, an intensity of a second peak wavelength P2 may have a range of 55% to 70% of a maximum peak intensity. A wavelength difference between a point ("wavelength") I1 of a lowest intensity between the first peak wavelength and the second peak wavelength and a point I2 of a lowest intensity between the second peak wavelength and the third peak wavelength of the white light may be in a range of 90 nm to 105 nm. A wavelength difference between the point I2 of a lowest intensity between the second peak wavelength and the third peak wavelength and a point I3 of 780 nm may be in a range of 195 nm to 210 nm. In other words, a wavelength of a lowest intensity of the white light between the second peak wavelength and the third peak is in a range of 570 nm to 585 nm.

Hereinafter, an effect according to Examples of the present inventive concepts will be described in detail by comparing Examples with Comparative Examples outside the scope of the present inventive concepts. Here, Examples of the present inventive concepts may be defined in a different view (for example, TM-30-15) from a profile of an emission spectrum.

Comparative Example

To be compared with white light emitted by white light emitting devices according to Examples 1 and 2, Comparative Examples 1 through 5, representing commercialized vivid lighting devices according to the related art, were selected. As Comparative Examples based on a near-ultraviolet light emitting diode, crisp white lighting of Lumileds Inc. (Comparative Example 1), vivid lighting of Sorra Inc. (Comparative Example 2), and vivid lighting of Citizen Inc. (Comparative Example 3) were used. As Comparative Examples based on a blue light emitting diode in a manner similar to the Examples, M7 lighting devices of Nichia Inc. (Comparative Example 4) and vivid lighting devices of Toyoda Gosei Inc. (Comparative Example 5) were used.

Figure 3:
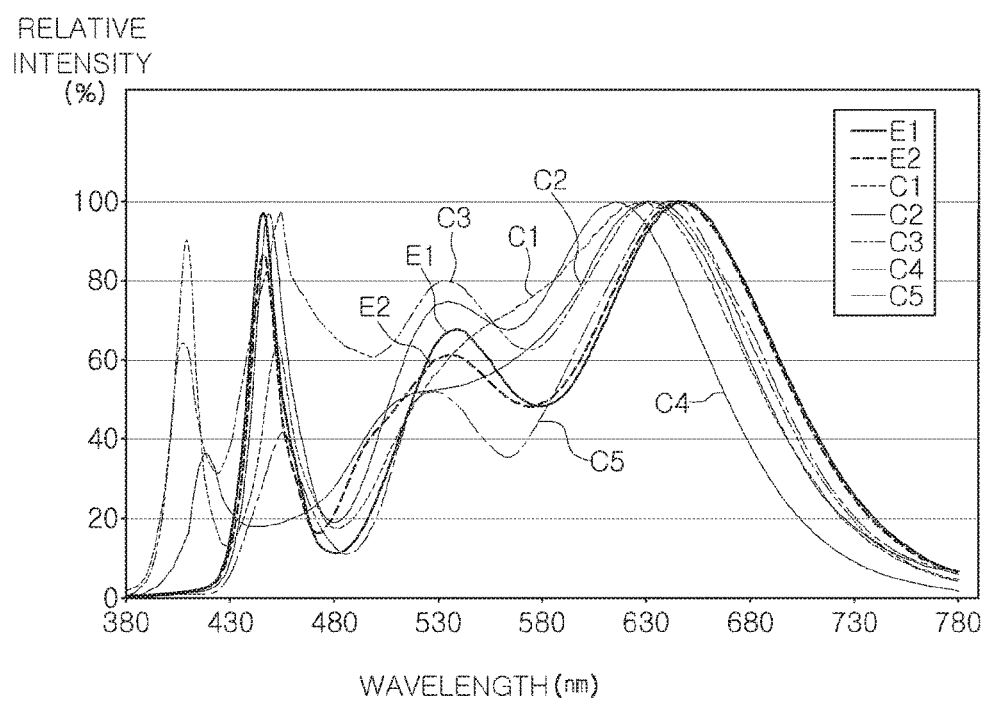
FIG. 3 is a graph illustrating an emission spectrum of white light according to some example embodiments.

Emission spectra of white light according to Comparative Examples 1 through 5 (e.g., emission spectra of white light emitted by Comparative Examples 1 through 5), respectively, are illustrated with emission spectra according to Examples 1 and 2, respectively, in a graph of FIG. 3.

White light emitted by white light emitting devices according to the Examples and Comparative Examples 1 through 5, described above, is evaluated using IES TM-30-15 indices. In detail, evaluation was carried out with a IES TM-30-15 fidelity index, $R_f$, a IES TM-30-15 gamut index $R_g$, as well as IES TM-30-15 $R_{cs15}$ and IES TM-30-15 $R_{cs16}$, and is illustrated in Table 3.

TABLE 3

| Division | $R_f$ | $R_g$ | $R_{cs15}$ | $R_{cs16}$ |
|---|---|---|---|---|
| Example 1 | 80.7 | 114.3 | 14% | 14% |
| Example 2 | 87.0 | 111.9 | 9% | 11% |
| Comparative Example 1 | 85.3 | 104.3 | 4% | −1% |
| Comparative Example 2 | 92.1 | 101.5 | 1% | −4% |
| Comparative Example 3 | 92.0 | 106.5 | 5% | 7% |
| Comparative Example 4 | 89.0 | 103.7 | 4% | 2% |
| Comparative Example 5 | 88.0 | 111.8 | 5% | 9% |

In some example embodiments, the white light emitted by one of the Examples and the Comparative Examples may be specified by ("at least partially defined by," "associated with," etc.) a vivid preference $S_{vp}$ based on the statistical evaluation of the preference for color associated with the respective emitted white light, with Equation 1. Here, A, B, and C represent $R_f$, $R_{cs15}$, and $R_{cs16}$ indices of white light, respectively.

$$S_{vp} = -36.76 + A(-5.45 \cdot 10^{-3} \cdot A + 0.915) + B(-6.69 \cdot 10^{-4} \cdot B^2 + 1.69 \cdot 10^{-2} \cdot B - 0.114) + C(-6.65 \cdot 10^{-4} \cdot C^2 + 2.27 \cdot 10^{-2} \cdot C - 0.18)$$ [Equation 1]

Preference $S_{vp}$ for emitted white light associated with Examples 1 and 2 and Comparative Examples 1 through 5, described above, is calculated and a result thereof is illustrated in Table 4.

TABLE 4

| Division | Preference $S_{vp}$ |
|---|---|
| Example 1 | 1.58 |
| Example 2 | 1.34 |
| Comparative Example 1 | 1.26 |
| Comparative Example 2 | 0.8 |
| Comparative Example 3 | 0.69 |
| Comparative Example 4 | 1.01 |
| Comparative Example 5 | 1.07 |

As a result of a separate statistical survey, as a preference $S_{vp}$ is higher, it is confirmed that a degree of vividness of an actual color of the white light emitted by the Examples is higher than the degree of vividness of an actual color of the white light emitted by the Comparative Examples. It is confirmed that a preference $S_{vp}$ in the case of Examples 1 and 2 is equal to or greater than 1.3, while a preference $S_{vp}$ in the case of the Comparative Examples is lower than 1 or lower than 1.3, which is lower than the preference $S_{vp}$ according to the Examples.

From the calculation result of the preference $S_{vp}$, it is confirmed that white light emitting devices according to some example embodiments are configured to emit white light associated with an enhanced degree of vividness of a color based on the white light emitting devices being configured to emit white light that is associated with particular ranges of values of $R_f$, $R_{cs15}$, and $R_{cs16}$, in the same manner as in the Examples.

In detail, when the light emitting devices according to some example embodiments are configured to emit white light that satisfies conditions in which (e.g., is associated with) $R_f$ is in a range of 78 to 89, $R_{cs15}$ is in a range of 7% to 16%, and $R_{cs16}$ is in a range of 7% to 16%, it may be expected that the light emitting devices are configured to emit white light having improved vividness. As a result of FIG. 2 and Table 2, a color difference of a reflection spectrum of the emitted white light according to some example embodiments and CIE Standard Illuminant D65 may be equal to or less than 106. Additionally, the emitted white light may have $R_g$ of equal to or greater than 110, based on TM-30-15 evaluation criteria. In some example embodiments, if and/or when a light emitting device emits white light that satisfies one or more conditions in which $R_f$ is out of the range of 78 to 89, $R_{cs15}$ is out of the range of 7% to 16%, and/or $R_{cs16}$ is out of the range of 7% to 16%, the light emitting device may emit white light having degraded vividness.

To check the correlation between the preference $S_{vp}$ and the TM-30-15 indices, the same type of phosphor used in Examples 1 and 2 described above was used with a different mixing ratio, so that additional Comparative Examples A through D (①  to ④) were manufactured.

Figure 4:
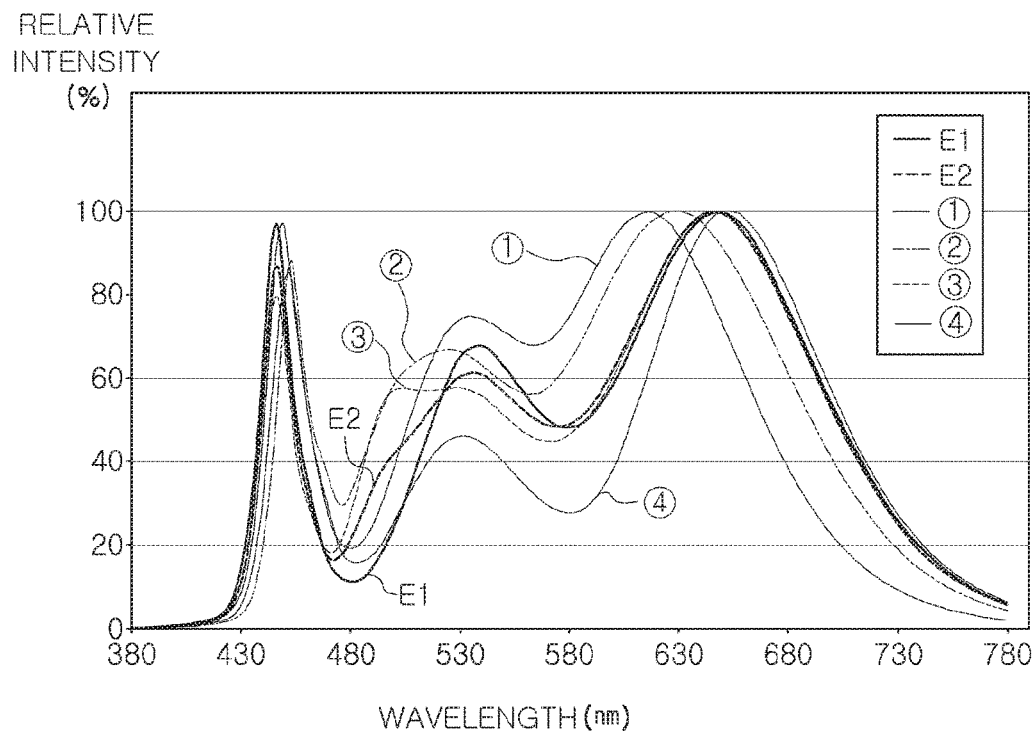
FIG. 4 is a graph illustrating an emission spectrum of white light according to some example embodiments.

Regarding the additional Comparative Examples A through D (① to ④), a spectrum was designed to have TM-30-15 indices illustrated in Table 5 by adjusting a mixing ratio of phosphors, and an emission spectrum appears as a graph, illustrated in FIG. 4.

TABLE 5

| Division | $R_f$ | $R_g$ | $R_{cs15}$ | $R_{cs16}$ | $S_{vp}$ |
|---|---|---|---|---|---|
| Example 1 | 80.7 | 114.3 | 14% | 14% | 1.58 |
| Example 2 | 87.0 | 111.9 | 9% | 11% | 1.34 |
| Comparative Example A | 89.0 | 103.7 | 4% | 2% | 1.0 |
| Comparative Example B | 89.3 | 102.6 | 0% | 4% | 1.06 |
| Comparative Example C | 85.3 | 110.4 | 6% | 11% | 1.31 |
| Comparative Example D | 76.8 | 120.3 | 15% | 20% | 1.37 |

Figure 5:
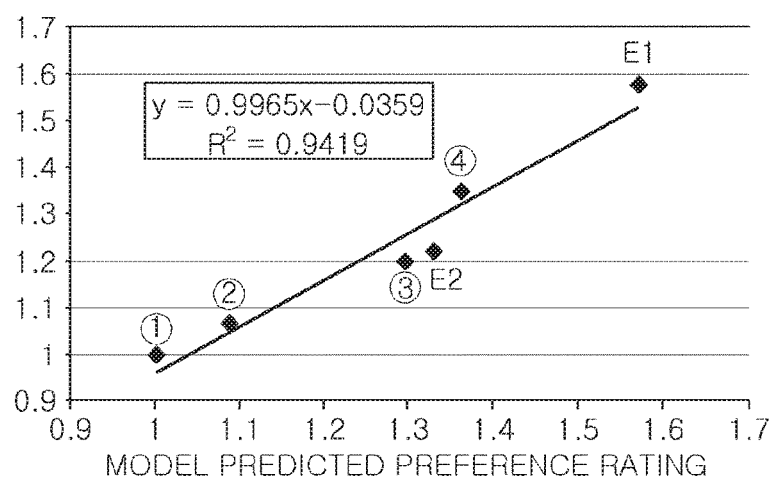
FIG. 5 is a graph illustrating a model predicted preference rating of white light according to some example embodiments.

The correlation between the indices of Examples 1 and 2 and Comparative Examples A through D, and the preference obtained by an emotion assessment, was analyzed, so the preference $S_{vp}$, described previously, was derived therefrom. FIG. 5 is a graph illustrating a model predicted preference rating of white light used to derive the correlation.

In terms of the preference, Comparative Examples ③ and ④ may be included in the conditions of the present inventive concepts. However, in the case of Comparative Example C, $R_{cs15}$ is 6%, which is out of a range (7 to 16) of the present inventive concepts. In the case of Comparative Example D, $R_f$ is 76.8, which is out of a range (78 to 89) of the present inventive concepts. Thus, a degree of vividness of a color of light emitted by Comparative Examples A to D may not be significant, and a color difference from a Standard Illuminant is significant in practice with regard to the light emitted by Comparative Examples A to D.

Hereinafter, some example embodiments of the present inventive concepts will be described in detail with reference to the accompanying drawings.

Figure 6:
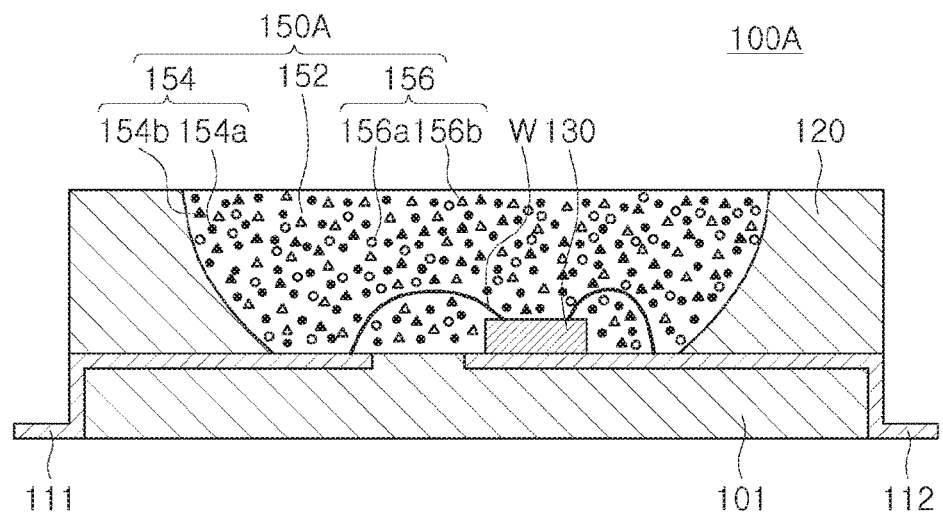
FIGS. 6 and 7 are schematic views illustrating a white light emitting device according to some example embodiments.

FIG. 6 is a schematic cross-sectional view of a white light emitting device according to some example embodiments.

Referring to FIG. 6, a white light emitting device 100A may include a package substrate 101, a semiconductor light emitting element 130 disposed on the package substrate 101, and a wavelength conversion device 150A. In addition, the white light emitting device 100A may include a pair of lead frames 111 and 112 electrically connected to the semiconductor light emitting element 130, a reflecting side wall portion 120 having a cup shape, and a conductive wire W connecting the semiconductor light emitting element 130 to the lead frames 111 and 112.

The package substrate 101 may be formed of ("may at least partially comprise") an opaque resin or a resin having a high reflectivity, or may include a polymer resin which is configured to facilitate injection molding. In some example embodiments, the package substrate 101 may include a ceramic, such that the package substrate 101 may be configured to enable easy dissipation of heat. According to some example embodiments of the present inventive concepts, the package substrate 101 may be a printed circuit board (PCB) with a wiring pattern formed thereon.

A reflecting side wall portion 120 may be disposed on the package substrate 101 and the lead frames 111 and 112 to form a cavity configured to receive the semiconductor light emitting element 130. The semiconductor light emitting element 130 may include, for example, a blue light emitting diode. The reflecting side wall portion 120 may have a cup shape, such that light reflection efficiency may be increased, but is not limited thereto. According to some example embodiments of the present inventive concepts, the reflecting side wall portion 120 may be integrated with the package substrate 101, such that the reflecting side wall portion 120 and the package substrate 101 comprise an individual, continuous material structure.

The semiconductor light emitting element 130 may be disposed on an upper surface of the package substrate 101, and may include an epitaxially grown semiconductor layer. The semiconductor light emitting element 130 may be a blue light emitting diode configured to emit blue light, for example, light having a dominant wavelength ranging from 440 nm to 455 nm.

The wavelength conversion device 150A may be disposed in the cavity surrounded by the reflecting side wall portion 120, and may include an encapsulating layer 152, a set ("plurality") of green phosphors 154 configured to emit green light having different wavelengths, including a first green phosphor 154a and a second green phosphor 154b, as well as a set of red phosphors 156 configured to emit red light having different wavelengths, including a first red phosphor 156a and a second red phosphor 156b, scattered in the encapsulating layer 152. The set of green phosphors may comprise a first wavelength conversion material configured to be excited by the blue light and emit green light. The set of red phosphors 156 may comprise a second wavelength conversion material configured to be excited by the blue light and emit red light. The set of green phosphors 154 and the set of red phosphors 156 may comprise, alone or in combination with the encapsulating layer 152, a plurality of wavelength conversion materials configured to convert the emitted blue light that is emitted by the semiconductor light emitting element 130 into light having different wavelengths based on being excited by the emitted blue light, and emit white light based on the converting the emitted blue light, such that the white light emitting device 100A may be understood to be configured to emit the emitted white light based on converting at least a portion of the blue light emitted by the semiconductor light emitting element 130, where the emitted white light is the "white light" as described herein that is associated with one or more of the aforementioned characteristics as described herein (e.g., associated with an Illuminating Engineering Society (IES) TM-30-15 Fidelity Index ($R_f$) in a range of 78 to 89, an IES TM-30-15 Chroma Change by Hue Index $R_{cs15}$ in a range of 7% to 16%, and an IES TM-30-15 Chroma Change by Hue Index $R_{cs16}$ in a range of 7% to 16%, and wherein a color difference between a reflection spectrum of a white specimen of the emitted white light and International Commission on Illumination (CIE) Standard illuminant D65 is equal to or less than 106, the white specimen having a white color corresponding to Munsell N9). The white light emitting device 100A may be understood to be configured to emit the white light based on mixing the blue light emitted by the semiconductor light emitting element 130, the green light emitted by the first wavelength conversion material (e.g., some or all of the set of green phosphors 154), and the red light emitted by the second wavelength conversion material (e.g., some or all of the set of red phosphors 156). It will be further understood that the white light emitting device may be configured to emit the white light such that the white light has an emission spectrum including a first peak wavelength in a range of 440 nm to 455 nm, a second peak wavelength in a range of 530 nm to 540 nm, and a third peak wavelength in a range of 640 nm to 650 nm, wherein a lowest intensity of the emitted white light between the second peak wavelength and the third peak wavelength, the lowest intensity of the emitted white light being 45% to 55% of a maximum peak intensity of the emitted white light among the first peak wavelength, the second peak wavelength, and the third peak wavelength. In some example embodiments, the white light emitting device 100A is configured to emit white light such that a color difference between a reflection spectrum of a white specimen of the emitted white light, and International Commission on Illumination (CIE) Standard illuminant D65, is equal to or less than 106, and the white specimen has a white color corresponding to Munsell N9. The white light emitting device may be configured to emit white light such that the emitted white light is associated with the preference $S_{vp}$, where $S_{vp}$ is equal to or greater than 1.3.

The encapsulating layer 152 may include a light transmitting resin such as an epoxy, a silicone, a strained silicone, a urethane resin, an oxetane resin, an acrylic, a polycarbonate, a polyimide, and combinations thereof.

The wavelength conversion device 150A may be configured to be excited by the blue light emitted by the semiconductor light emitting element 130 to emit visible light having been wavelength-converted.

Due to the blue light (e.g., based on receiving the blue light), the first green phosphor 154a and the second green phosphor 154b may be configured to emit first green light and second green light that are different from each other. For example, the first green light may have a peak wavelength of 515 nm to 530 nm and a full width at half-maximum of 50 nm or more, and the second green light may have a peak wavelength of 535 nm to 555 nm and a full width at half-maximum of 70 nm or less. For example, the first green phosphor 154a may include $(Ba,Sr)_2SiO_4$:Eu, and the second green phosphor 154b may include β-SiAlON:Eu.

Due to the blue light (e.g., based on receiving the blue light), the first red phosphor 156a and the second red phosphor 156b may be configured to emit first red light and second red light that are different from each other. In some example embodiments, the first red light may have a peak wavelength of 600 nm to 620 nm and a full width at half-maximum equal to or greater than 85 nm, and the second red light may have a peak wavelength of 640 nm to 665 nm and a full width at half-maximum equal to or less than 80 nm. For example, the first red phosphor 156a may include $(Sr,Ca)AlSiN_3$:Eu, and the second red phosphor 156b may include $CaAlSiN_3$:Eu.

By using ("including") a combination of these phosphors, the wavelength conversion device 150A may be configured to be excited by the blue light emitted by the semiconductor light emitting element 130 to emit white light having a spectrum as described above. An emission spectrum of the white light ("the emitted white light"), obtained from ("emitted by") the white light emitting device 100A according to some example embodiments, may have a first peak wavelength in a range of 440 nm to 455 nm, a second peak wavelength in a range of 530 nm to 540 nm, and a third peak wavelength in a range of 640 nm to 650 nm. In addition, an intensity of the second peak wavelength may be 55% to 70% of a maximum peak intensity, and a lowest intensity between the second peak wavelength and the third peak wavelength may be 45% to 55% of the maximum peak intensity (referring to Example 1). Furthermore, the white light emitted by the white light emitting device 100A may satisfy conditions in which (e.g., may be associated with) $R_f$ is in a range of 78 to 89, $R_{cs15}$ is in a range of 7% to 16%, $R_{cs16}$ is in a range of 7% to 16%, based on IES TM-30-15 evaluation criteria, and a color difference of a reflection spectrum of the white light and CIE Standard Illuminant D65 may be equal to or less than 106.

Figure 7:
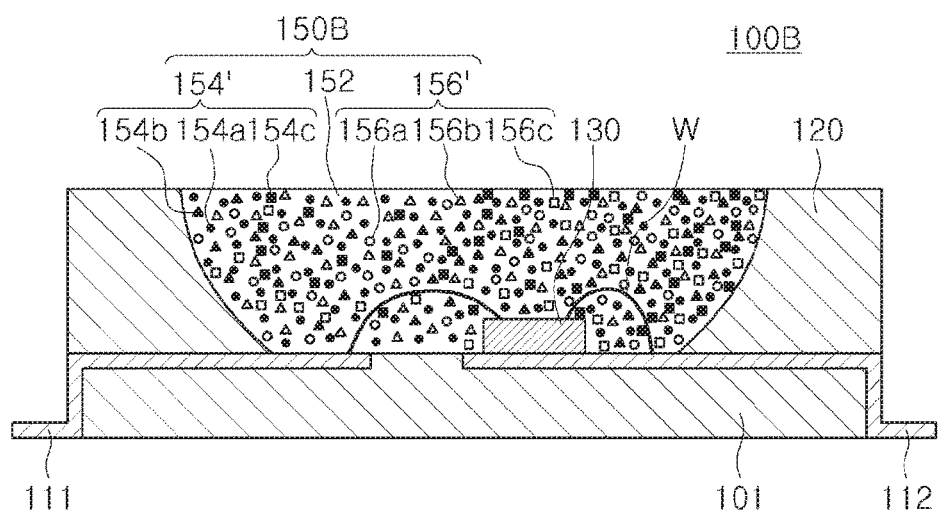

FIG. 7 is a schematic cross-sectional view of a white light emitting device according to some example embodiments.

A white light emitting device 100B according to some example embodiments may have the same or similar components as those of the previously-described example embodiments, except for a wavelength conversion device 150B.

The wavelength conversion device 150B in some example embodiments may include a set ("plurality") of green phosphors 154' configured to emit green light having different wavelengths that further includes, in addition to the first green phosphor 154a and the second green phosphor 154b, a third green phosphor 154c and may include a set of red phosphors 156' configured to emit red light having different wavelengths that further includes, in addition to the first red phosphor 156a and the second red phosphor 156b, a third red phosphor 156c.

The set of green phosphors 154' and the set of red phosphors 156' may comprise, alone or in combination with the encapsulating layer 152, a plurality of wavelength conversion materials configured to convert the emitted blue light that is emitted by the semiconductor light emitting element 130 into light having different wavelengths based on being excited by the emitted blue light, and emit white light based on the converting the emitted blue light, such that the white light emitting device 100B may be understood to be configured to emit the emitted white light based on converting at least a portion of the blue light emitted by the semiconductor light emitting element 130, where the emitted white light is the "white light" as described herein that is associated with one or more of the aforementioned characteristics as described herein (e.g., associated with an Illuminating Engineering Society (IES) TM-30-15 Fidelity Index ($R_f$) in a range of 78 to 89, an IES TM-30-15 Chroma Change by Hue Index $R_{cs15}$ in a range of 7% to 16%, and an IES TM-30-15 Chroma Change by Hue Index $R_{cs16}$ in a range of 7% to 16%, and wherein a color difference between a reflection spectrum of a white specimen of the emitted white light and International Commission on Illumination (CIE) Standard illuminant D65 is equal to or less than 106, the white specimen having a white color corresponding to Munsell N9). The white light emitting device 100B may be understood to be configured to emit the white light based on mixing the blue light emitted by the semiconductor light emitting element 130, the green light emitted by the first wavelength conversion material (e.g., some or all of the set of green phosphors 154'), and the red light emitted by the second wavelength conversion material (e.g., some or all of the set of red phosphors 156'). It will be further understood that the white light emitting device may be configured to emit the white light such that the white light has an emission spectrum including a first peak wavelength in a range of 440 nm to 455 nm, a second peak wavelength in a range of 530 nm to 540 nm, and a third peak wavelength in a range of 640 nm to 650 nm, wherein a lowest intensity of the emitted white light between the second peak wavelength and the third peak wavelength, the lowest intensity of the emitted white light being 45% to 55% of a maximum peak intensity of the emitted white light among the first peak wavelength, the second peak wavelength, and the third peak wavelength. In some example embodiments, the white light emitting device 100B is configured to emit white light such that a color difference between a reflection spectrum of a white specimen of the emitted white light, and International Commission on Illumination (CIE) Standard illuminant D65, is equal to or less than 106, and the white specimen has a white color corresponding to Munsell N9. The white light emitting device may be configured to emit white light such that the emitted white light is associated with the preference $S_{vp}$, where $S_{vp}$ is equal to or greater than 1.3.

The third green phosphor 154c may emit third green light, different from first green light and second green light, and the third red phosphor 156c may emit third red light different from first red light and second red light. In some example embodiments, the third green phosphor 154c may emit light having a peak wavelength of 490 nm to 510 nm, and the third red phosphor 156c may emit light having a peak wavelength of 590 nm to 610 nm, shorter than a peak wavelength of the first red light. For example, the third green phosphor may include $BaSi_2O_2N_2$:Eu, and the third red phosphor may include Ca-α-SiAlON:Eu.

By using a combination of these phosphors, the wavelength conversion device 150B may be configured to be excited by the blue light emitted by the semiconductor light emitting element 130 to emit white light having a spectrum of white light, as similarly described above (referring to Example 2).

Figure 8:
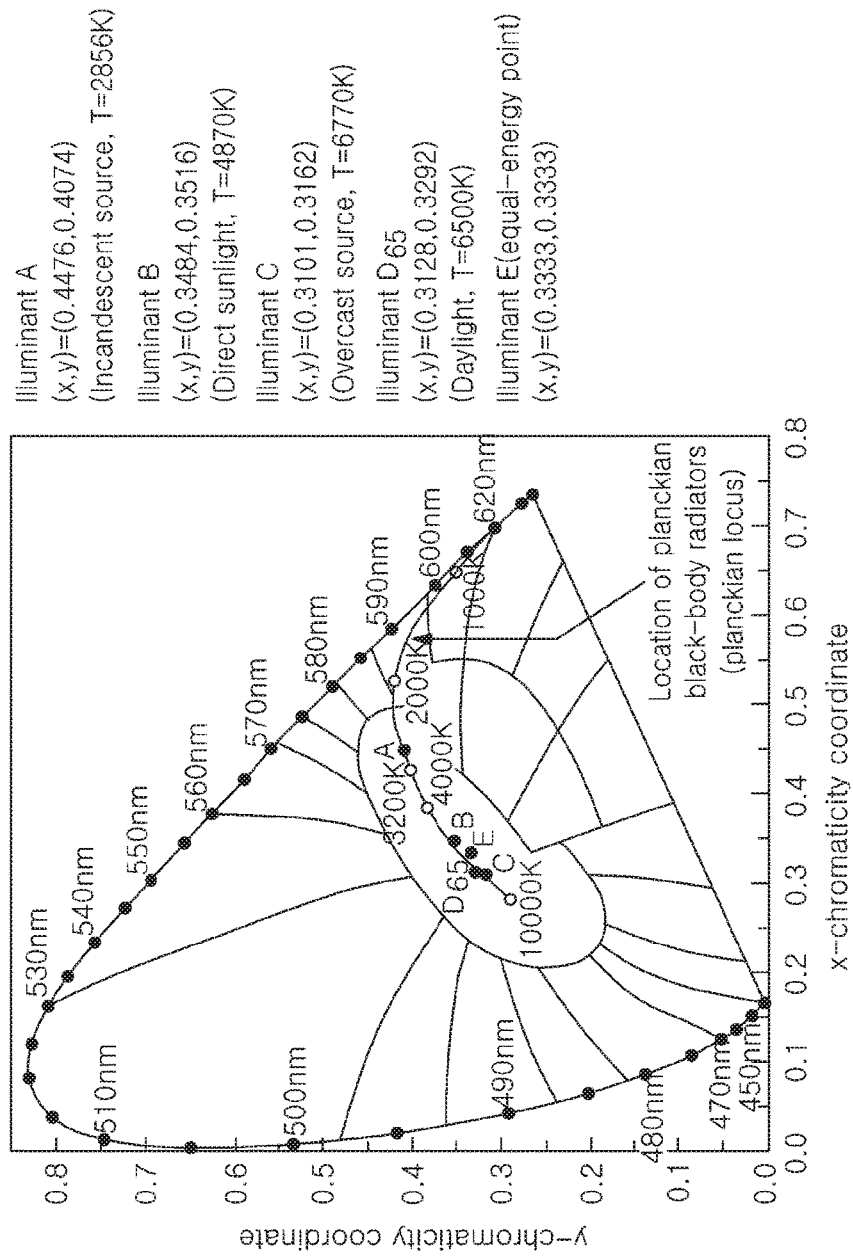
FIG. 8 is a CIE 1931 color space diagram illustrating a wavelength conversion material employable in a white light emitting device according to some example embodiments.

FIG. 8 is a CIE 1931 color space diagram illustrating a position of a wavelength conversion material employable in a light emitting device according to some example embodiments of the present inventive concepts.

Other types of green and red phosphors may be used to provide white light of a desired spectrum. A different type of phosphor from the red or green phosphors illustrated above, while satisfying TM-30-15 indices conditions and/or spectrum conditions, described above may be used.

For example, as a green phosphor, a $L_3M_5O_{12}$:Ce (here, L is at least one of lutetium (Lu), ytterbium (Yb), and terbium (Tb), and M is at least one of aluminum (Al) and gallium (Ga)) oxide phosphor may be included as a wavelength conversion material in a wavelength conversion device as described herein. The oxide phosphor may include $Tb_3Al_5O_{12}$:Ce and $Lu_3Al_5O_{12}$:Ce.

In addition, the phosphors may also be replaced by other wavelength conversion materials, such as quantum dots. The quantum dots may be mixed with the phosphors or used alone in a certain wavelength band. Each of the quantum dots may include a structure of a core (3 nm to 10 nm), such as CdSe and InP, a shell (0.5 nm to 2 nm), such as ZnS and ZnSe, and a ligand configured to stabilize the core and shell, and may realize various colors according to sizes.

As illustrated in FIG. 8, (x, y) coordinates of the CIE 1931 color space diagram may be located in an area of a line segment connecting the following coordinates: (0.4476, 0.4074), (0.3484, 0.3516), (0.3101, 0.3162), (0.3128, 0.3292), and (0.3333, 0.3333). Alternatively, the (x, y) coordinates may be located in an area surrounded by the line segment and a black body locus (BBL).

For example, white light near a point E (0.3333, 0.3333) below BBL may be used as a light source for lighting, to create clearer or fresher viewing conditions for the naked eye in a state in which light having a yellow-based component is reduced. Thus, a lighting product using white light around the point E (0.3333, 0.3333) below BBL may be usefully employed as a lighting device for a retail space in which groceries, clothing, or the like are for sale. A spectrum of white light emitted by a white light emitting device in some example embodiments of the present inventive concepts may satisfy the conditions described above, and may have a correlated color temperature (CCT) higher than a correlated color temperature (for example, 3000 K to 3100 K) of vivid lighting based on an ultraviolet light emitting diode (LED). For example, the correlated color temperature of the emitted white light according to some example embodiments may correspond to a range of 3300 K to 3700 K. In another example, for example, the correlated color temperature of the emitted white light according to some example embodiments may correspond to a range of more than 3300 K.

The white light emitting devices according to some example embodiments may thus be advantageously used in various types of lighting devices, as an excellent source of vivid lighting having an enhanced (improved) degree of vividness of a color.

Figure 9:
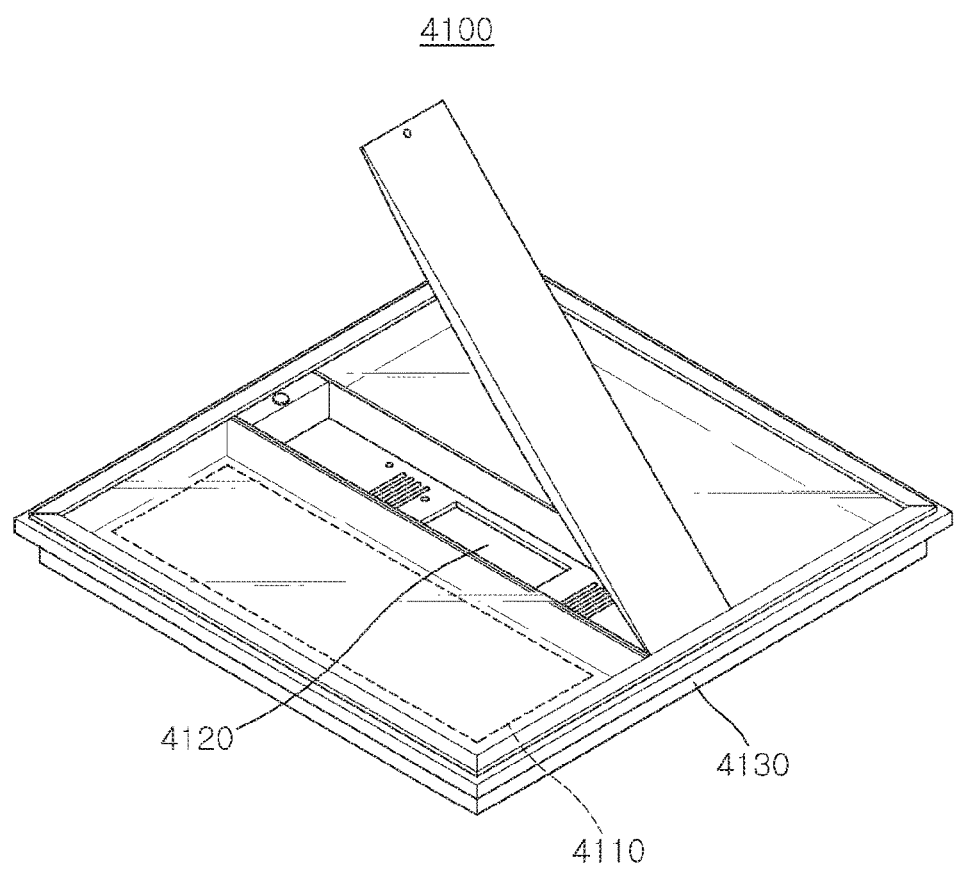
FIG. 9 is a perspective view schematically illustrating a flat lighting device according to some example embodiments.

FIG. 9 is a perspective view schematically illustrating a flat lighting device according to some example embodiments.

Referring to FIG. 9, a flat lighting device 4100 may include a light source module 4110, a power supply 4120, and a housing 4130. A light source forming the light source module 4110 may be a white light emitting device according to some example embodiments of the present inventive concepts. For example, the white light emitting device may be a white light emitting device illustrated in FIGS. 6 and 7. The power supply 4120 may include an LED driver.

The light source module 4110 may include a light source array, and may have an overall flat shape. According to some example embodiments, the light source module 4110 may include an LED and a controller storing driving information on the LED.

The power supply 4120 may be configured to supply power to the light source module 4110. The housing 4130 may have a housing space to receive the light source module 4110 and the power supply 4120 therein, and may have a hexahedral shape with an open surface, but is not limited thereto. The light source module 4110 may be disposed to emit light toward the open surface of the housing 4130.

In a manner different from some example embodiments, at least a portion of phosphors of combinations of the phosphors employed in the white light emitting device may be disposed in other components than the white light emitting device (for example, a light guide plate, a diffusion plate, a lens) of the flat lighting device 4100.

Figure 10:
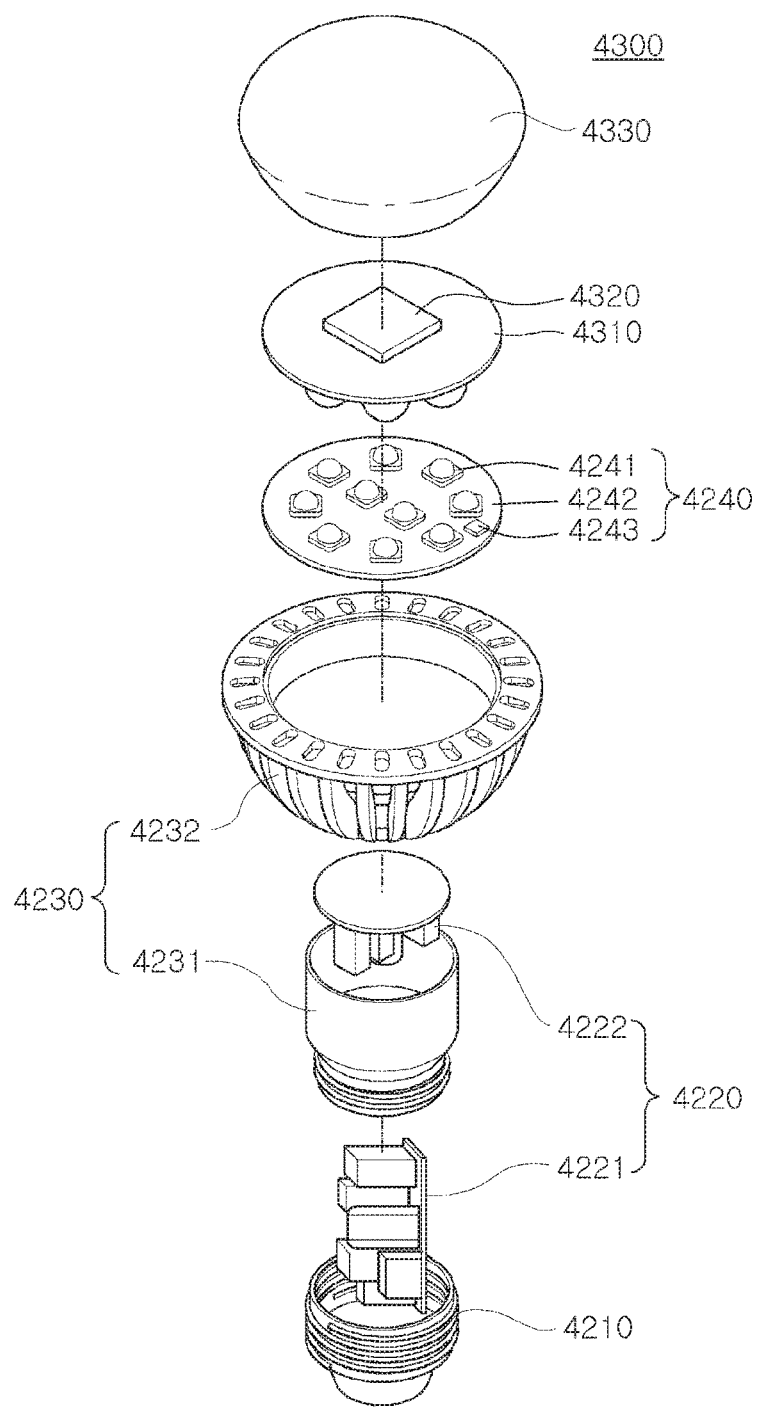
FIG. 10 is an exploded perspective view illustrating a bulb lighting device according to some example embodiments.

FIG. 10 is an exploded perspective view illustrating a bulb lighting device according to some example embodiments.

Referring to FIG. 10, a bulb lighting device 4300 may include a socket 4210, a power supply 4220, a heat dissipation portion 4230, a light source module 4240, and a cover 4330.

The socket 4210 may be configured to replace that of a lighting device according to the related art. Power supplied to the bulb lighting device 4300 may be applied through the socket 4210. As illustrated in FIG. 10, the power supply 4220 may be attached separately to a first power supply device 4221 and a second power supply device 4222. The heat dissipation portion 4230 may include an internal heat dissipation portion 4231 and an external heat dissipation portion 4232. The internal heat dissipation portion 4231 may be directly connected to the light source module 4240 and/or the power supply 4220, which may allow heat to be transferred to the external heat dissipation portion 4232. The cover 4330 may be configured to evenly diffuse light emitted by the light source module 4240.

The light source module 4240 may receive power from the power supply 4220 to emit light to the cover 4330. The light source module 4240 may include at least one light source 4241, a circuit board 4242, and a controller 4243, and the controller 4243 may store driving information on the at least one light source 4241. The light source 4241 may be a light emitting device satisfying white light conditions according to aforementioned embodiments. For example, the light source 4241 may be one of the white light emitting devices illustrated in FIGS. 6 and 7, respectively.

In some example embodiments, at least a portion of phosphors of combinations of the phosphors employed in the white light emitting device may be disposed in other components of the bulb lighting device 4300 than the white light emitting device. For example, the at least a portion of phosphors thereof may be disposed in an optical element (for example, a diffuser plate, a light guide plate) located in a path through which light travels.

The bulb lighting device 4300 according to some example embodiments of the present inventive concepts may include a reflector 4310 disposed above the light source module 4240, and may reduce glare by evenly diffusing light emitted by the at least one light source 4241 to a side and rear of the reflector.

A communications module 4320 may be mounted on an upper portion of the reflector 4310, and may perform home network communications. For example, the communications module 4320 may a wireless communications module using Zigbee®, Wi-Fi, or Li-Fi, and may control on/off functions and brightness of a lighting device installed in and around the home through a smartphone or wireless controller. Further, use of a Li-Fi communications module using a visible light wavelength of a lighting device installed in and around the hole may control electronics, such as a TV, a refrigerator, an air-conditioner, a door lock, or may control a vehicle.

The reflector 4310 and the communications module 4320 may be covered with a cover 4330.

Figure 11:
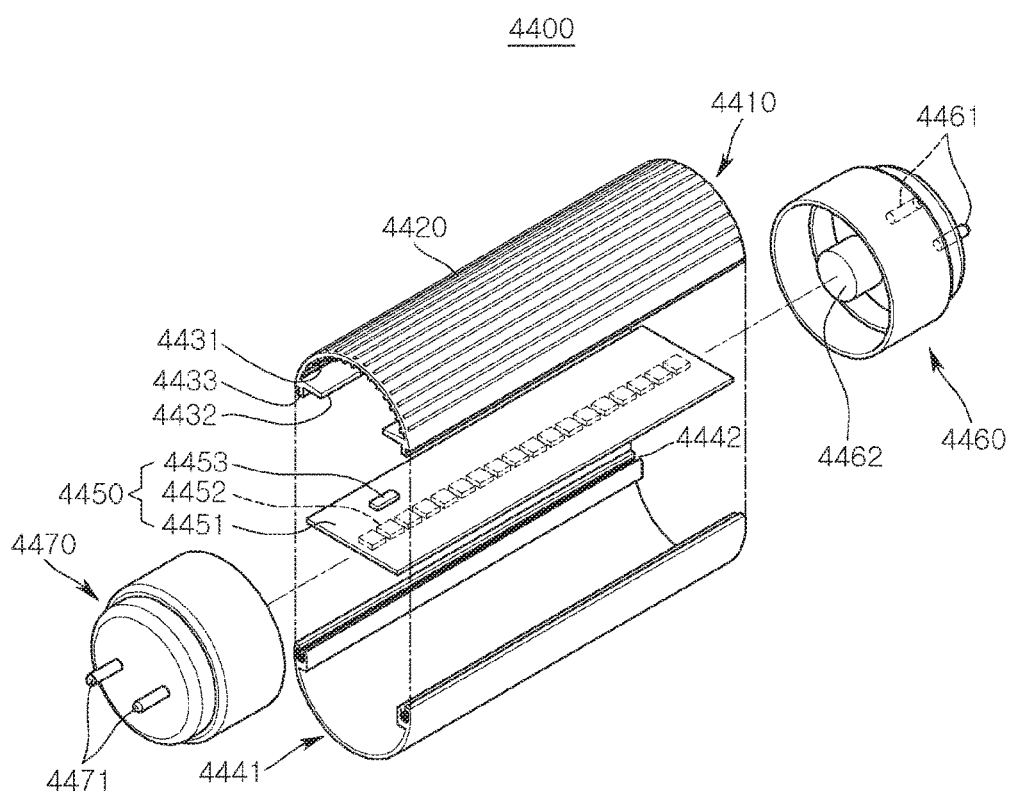
FIG. 11 is an exploded perspective view illustrating a tube lighting device according to some example embodiments.

FIG. 11 is an exploded perspective view illustrating a tube lighting device according to some example embodiments.

Referring to FIG. 11, a tube lighting device 4400 may have protrusions 4433 formed on opposing ends of a heat dissipation member 4410. The tube lighting device 4400 may include the heat dissipation member 4410, a cover 4441, a light source module 4450, a first socket 4460, and a second socket 4470. A plurality of heat dissipation fins 4420 and 4431 may be formed to have an uneven shape on internal or/and external surfaces of the heat dissipation member 4410, and may be designed to have various shapes and intervals. Supports 4432 in the protruding form may be formed on an inside of the heat dissipation member 4410. The light source module 4450 may be fixed to the supports 4432. The protrusions 4433 may be formed on opposing ends of the heat dissipation member 4410.

Grooves 4442 may be formed in the cover 4441, and the protrusions 4433 of the heat dissipation member 4410 may be coupled to the grooves 4442 by a hooked coupling structure. The locations of the grooves 4442 and the protrusions 4433 may correspond to each other.

The light source module 4450 may include a printed circuit board (PCB) 4451, light sources 4452, and a controller 4453. As described above, the controller 4453 may store driving information on the light sources 4452. The PCB 4451 may have circuit lines formed thereon to operate the light sources 4452, and may also include components for operating the light sources 4452. The light sources 4452 may be a light emitting device satisfying white light conditions according to the aforementioned embodiments. For example, the light sources 4452 may be one of the white light emitting devices illustrated in FIGS. 6 and 7, respectively.

The first socket 4460 and the second socket 4470 may have a structure of being coupled to both ends of a cylindrical cover device, including the heat dissipation member 4410 and the cover 4441, as a pair of sockets. For example, the first socket 4460 may include electrode terminals 4461 and a power supply 4462, and the second socket 4470 may include dummy terminals 4471 disposed thereon. In addition, one of the first socket 4460 and the second socket 4470 may have an optical sensor and/or a communications module embedded therein. For example, the second socket 4470 with the dummy terminals 4471 disposed thereon may have an optical sensor and/or a communications module embedded therein. In some example embodiments, the first socket 4460 with the electrode terminals 4461 disposed thereon may have an optical sensor and/or a communications module.

As set forth above, according to some example embodiments of the present inventive concepts, a white light emitting device emitting white light with an enhanced degree of vividness of white and primary colors based on a blue light emitting diode, and a lighting device may be provided. An emission spectrum of white light emitted by the white light emitting device may be at least partially defined by ("associated with," "characterized by," etc.) $R_f$, $R_{cs15}$, and $R_{cs16}$ indices, based on the TM-30-15 evaluation criteria. A novel index ($S_{vp}$ index), with respect to preference of illumination light may be derived, and excellent vivid white light, qualified by actual statistical evaluation, may be provided by the white light emitting device. A spectrum of the white light may be obtained by combinations of a wavelength conversion material proposed as part of the present inventive concepts.

While example embodiments have been shown and described above, it will be apparent to those skilled in the art that modifications and variations could be made without departing from the scope of the present disclosure, as defined by the appended claims.

What is claimed is:

1. A white light emitting device, comprising:
a blue light emitting diode configured to emit blue light; and
a plurality of wavelength conversion materials configured to
convert the emitted blue light into light having different wavelengths based on being excited by the emitted blue light, and
emit white light based on the converting the emitted blue light, such that
the emitted white light is associated with
an Illuminating Engineering Society (IES) TM-30-15 Fidelity Index ($R_f$) in a range of 78 to 89,
an IES TM-30-15 Chroma Change by Hue Index $R_{cs15}$ in a range of 7% to 16%, and
an IES TM-30-15 Chroma Change by Hue Index $R_{cs16}$ in a range of 7% to 16%, and
a color difference between a reflection spectrum of a white specimen of the emitted white light and International Commission on Illumination (CIE) Standard illuminant D65 is equal to or less than 106, the white specimen having a white color corresponding to Munsell N9.

2. The white light emitting device of claim 1, wherein, the emitted white light is associated with a preference $S_{vp}$, the preference $S_{vp}$ defined by $$S_{vp}=-36.76+A(-5.45\cdot10^{-3}\cdot A+0.915)+B(-6.69\cdot10^{-4}\cdot B^2+1.69\cdot10^{-2}\cdot B-0.114)+C(-6.65\cdot10^{-4}\cdot C^2+2.27\cdot10^{-2}\cdot C-0.18),$$

A is $R_f$, B is $R_{cs15}$, and C is $R_{cs16}$, and
$S_{vp}$ is equal to or greater than 1.3.

3. The white light emitting device of claim 1, wherein the emitted white light is associated with an IES TM-30-15 gamut index ($R_g$) equal to or greater than 110.

4. The white light emitting device of claim 1, wherein the emitted white light is associated with a correlated color temperature (CCT) that is equal to or greater than 3300K.

5. The white light emitting device of claim 1, wherein the emitted white light is associated with an emission spectrum having
a first peak wavelength in a range of 440 nm to 455 nm,
a second peak wavelength in a range of 530 nm to 540 nm, and
a third peak wavelength in a range of 640 nm to 650 nm.

6. The white light emitting device of claim 5, wherein a lowest intensity of the emitted white light between the second peak wavelength and the third peak wavelength is 45% to 55% of a maximum peak intensity of the emitted white light.

7. The white light emitting device of claim 5, wherein a wavelength difference between a wavelength of a lowest intensity of the emitted white light between the first peak wavelength and the second peak wavelength and a wavelength of a lowest intensity of the emitted white light between the second peak wavelength and the third peak wavelength is in a range of 90 nm to 105 nm, and the wavelength of the lowest intensity of the emitted white light between the second peak wavelength and the third peak wavelength is in a range of 570 nm to 585 nm.

8. The white light emitting device of claim 1, wherein
a dominant wavelength band of the emitted blue light is 440 nm to 455 nm, and
the plurality of wavelength conversion materials include
a plurality of green phosphors configured to emit green light having different wavelengths, and
a plurality of red phosphors configured to emit red light having different wavelengths.

9. The white light emitting device of claim 8, wherein the plurality of green phosphors include
a first green phosphor configured to emit first green light having a peak wavelength of 515 nm to 530 nm and a full width at half-maximum (FWHM) that is equal to or greater than 50 nm, and
a second green phosphor configured to emit second green light having a peak wavelength of 535 nm to 555 nm and a full width at half-maximum (FWHM) that is equal to or less than 70 nm.

10. The white light emitting device of claim 8, wherein the plurality of red phosphors include
a first red phosphor configured to emit first red light having a peak wavelength of 600 nm to 620 nm and a full width at half-maximum (FWHM) equal to or less than 85 nm, and
a second red phosphor configured to emit second red light having a peak wavelength of 640 nm to 665 nm and a full width at half-maximum (FWHM) equal to or greater than 80 nm.

11. A white light emitting device, comprising:
a blue light emitting diode configured to emit blue light;
a first wavelength conversion material configured to be excited by the blue light and emit green light; and
a second wavelength conversion material configured to be excited by the blue light and emit red light,
wherein the white light emitting device is configured to emit white light based on mixing the blue light, the green light, and the red light, the emitted white light having an emission spectrum including
a first peak wavelength in a range of 440 nm to 455 nm,
a second peak wavelength in a range of 530 nm to 540 nm, and
a third peak wavelength in a range of 640 nm to 650 nm,
wherein a lowest intensity of the emitted white light between the second peak wavelength and the third peak wavelength, the lowest intensity of the emitted white light being is 45% to 55% of a maximum peak intensity of the emitted white light among the first peak wavelength, the second peak wavelength, and the third peak wavelength,
wherein a color difference between a reflection spectrum of a white specimen of the emitted white light, and International Commission on Illumination (CIE) Standard illuminant D65, is equal to or less than 106, and the white specimen has a white color corresponding to Munsell N9.

12. The white light emitting device of claim 11, wherein, in the emission spectrum of the white light, a wavelength difference between a wavelength of a lowest intensity of the emitted white light between the first peak wavelength and the second peak wavelength and a wavelength of a lowest intensity of the emitted white light between the second peak wavelength and the third peak wavelength is in a range of 90 nm to 105 nm.

13. The white light emitting device of claim 11, wherein, in the emission spectrum of the emitted white light, a wavelength of the lowest intensity of the emitted white light between the second peak wavelength and the third peak wavelength is in a range of 570 nm to 585 nm.

14. The white light emitting device of claim 11, wherein an intensity of the second peak wavelength is 55% to 70% of the maximum peak intensity of the emitted white light.

15. The white light emitting device of claim 11, wherein
a dominant wavelength band of the blue light is 440 nm to 455 nm,
the first wavelength conversion material includes a first green phosphor configured to emit first green light having a peak wavelength of 515 nm to 530 nm and a full width at half-maximum (FWHM) that is equal to or greater than 50 nm, and a second green phosphor configured to emit second green light having a peak wavelength of 535 nm to 555 nm and a full width at half-maximum (FWHM) that is equal to or less than 70 nm, and
the second wavelength conversion material includes a first red phosphor configured to emit first red light having a peak wavelength of 600 nm to 620 nm and a full width at half-maximum (FWHM) that is equal to or less than 85 nm, and a second red phosphor configured to emit second red light having a peak wavelength of 640 nm to 665 nm and a full width at half-maximum (FWHM) that is equal to or greater than 80 nm.

16. The white light emitting device of claim 15, wherein
the first wavelength conversion material further includes a third green phosphor configured to emit light having a peak wavelength of 490 nm to 510 nm, and
the second wavelength conversion material further includes a third red phosphor configured to emit light having a peak wavelength of 590 nm to 610 nm, shorter than the peak wavelength of the first red light.

17. A white light emitting device, comprising:
a blue light emitting diode configured to emit blue light having a dominant wavelength band of 440 nm to 455 nm;
a first green phosphor configured to emit first green light based on being excited by the blue light, the first green light having a peak wavelength of 515 nm to 530 nm and a full width at half-maximum (FWHM) equal to or greater than 50 nm or more;
a second green phosphor configured to emit second green light based on being excited by the blue light, the second green light having a peak wavelength of 535 nm to 555 nm and a full width at half-maximum (FWHM) equal to or less than 70 nm;
a first red phosphor configured to emit first red light based on being excited by the blue light, the first red light having a peak wavelength of 600 nm to 620 nm and a full width at half-maximum (FWHM) equal to or less than 85 nm; and
a second red phosphor configured to emit second red light based on being excited by the blue light, the second red light having a peak wavelength of 640 nm to 665 nm and a full width at half-maximum (FWHM) equal to or greater than 80 nm,
wherein the white light emitting device is configured to emit white light based on mixing the blue light, the first green light, the second green light, the first red light, and the second red light,
wherein a color difference between a reflection spectrum of a white specimen of the emitted white light, and International Commission on Illumination (CIE) Standard illuminant D65, is equal to or less than 106, and the white specimen has a white color corresponding to Munsell N9.

18. The white light emitting device of claim 17, further comprising:
a third green phosphor configured to emit light having a peak wavelength of 490 nm to 510 nm, and
a third red phosphor configured to emit light having a peak wavelength of 590 nm to 610 nm, shorter than the peak wavelength of the first red light.

19. The white light emitting device of claim 17, wherein the emitted white light is associated with
an Illuminating Engineering Society (IES) TM-30-15 Fidelity Index ($R_f$) in a range of 78 to 89,
an IES TM-30-15 Chroma Change by Hue Index $R_{cs15}$ in a range of 7% to 16%, and
an IES TM-30-15 Chroma Change by Hue Index $R_{cs16}$ in a range of 7% to 16%, and
the emitted white light is associated with a preference $S_{vp}$, the preference $S_{vp}$ defined by $$S_{vp}=-36.76+A(-5.45\cdot10^{-3}\cdot A+0.915)+B(-6.69\cdot10^{-4}\cdot B^2+1.69\cdot10^{-2}\cdot B-0.114)+C(-6.65\cdot10^{-4}\cdot C^2+2.27\cdot10^{-2}\cdot C-0.18),\quad\text{[Equation 1]}$$

A is $R_f$, B is $R_{cs15}$, and C is $R_{cs16}$, and
$S_{vp}$ is equal to or greater than 1.3.

* * * * *